US006765519B2

(12) United States Patent
Karlquist

(10) Patent No.: US 6,765,519 B2
(45) Date of Patent: Jul. 20, 2004

(54) SYSTEM AND METHOD FOR DESIGNING AND USING ANALOG CIRCUITS OPERATING IN THE MODULATION DOMAIN

(75) Inventor: Richard K. Karlquist, Cupertino, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/328,304

(22) Filed: Dec. 23, 2002

(65) Prior Publication Data

US 2004/0119622 A1 Jun. 24, 2004

(51) Int. Cl.[7] .................................................. H03M 3/00
(52) U.S. Cl. ........................................ 341/143; 375/271
(58) Field of Search ................................. 341/143, 155; 342/433, 200; 332/145; 714/792; 375/271

(56) References Cited

U.S. PATENT DOCUMENTS

| | | | | | |
|---|---|---|---|---|---|
| 3,872,477 | A | * | 3/1975 | King | 342/433 |
| 4,229,715 | A | * | 10/1980 | Henry | 332/145 |
| 4,433,312 | A | * | 2/1984 | Kahn | 332/145 |
| 5,862,155 | A | * | 1/1999 | Lomp et al. | 714/792 |
| 5,995,552 | A | * | 11/1999 | Moriyama | 375/271 |
| 6,057,798 | A | * | 5/2000 | Burrier et al. | 342/200 |

OTHER PUBLICATIONS

U.S. patent application Ser. No. 10/328,363 Karlquist, filed Dec. 23, 2002.

U.S. patent application Ser. No. 10/328,298 Karlquist, filed Dec. 23, 2002.

U.S. patent application Ser. No. 10/328,358 Karlquist, filed Dec. 23, 2002.

Armstrong, Edwin H, "A Method of Reducing Disturbances in Radio Signalling by a System of Frequency Modulation", Proc. IRE, vol. 24, No. 5, May 1936, p. 689ff.

Jaffe, D.L., "Armstrong's Frequency Modulator", Proc. IRE, vol. 26, No. 4, Apr. 1938, p. 475ff.

* cited by examiner

*Primary Examiner*—Jean Bruner Jeanglaude

(57) ABSTRACT

A computation circuit operates in the modulation domain to generate a signal having phase modulation proportional to the ratio of the dividend (numerator) signal to the divisor (denominator) signal. The phase modulated signal may be demodulated by a phase demodulator to produce a baseband quotient signal. The divisor signal maintains inverse proportional control of the modulation gain of the modulator by varying the carrier injection level, resulting in higher bandwidth and accuracy, and lower drift and offset compared to traditional analog computation techniques. The circuit may contain all linear components, even though the division function is a non-linear function. The circuit and method operate when the input signals are analog or both are in the modulation domain.

25 Claims, 6 Drawing Sheets n(t)<<d(t)→ sin n(t)/d(t) ~ n(t)/d(t)
n(t)<<d(t)→ cos n(t)/d(t) ~ 1
→ d(t){cos ωt-[n(t)/d(t)] sin ωt}
~d(t){cos ωt cos n(t)/d(t)]+sin ωt sin [n(t)/d(t)]}
=d(t)cos [ωt+n(t)/d(t)]

$$\left.\begin{array}{l} m(t)<<1 \rightarrow \sin m(t) \sim m(t) \\ m(t)<<1 \rightarrow \cos m(t) \sim 1 \end{array}\right\} \rightarrow \cos \omega t - m(t)\sin \omega t \sim \cos \omega t \cos m(t) + \sin \omega t \sin m(t) = \cos[\omega t + m(t)]$$

SYSTEM AND METHOD FOR DESIGNING AND USING ANALOG CIRCUITS OPERATING IN THE MODULATION DOMAIN

CROSS-REFERENCE TO RELATED APPLICATIONS

The present application is related to concurrently filed, co-pending, and commonly assigned U.S. patent application Ser. No. 10/328,298, filed Dec. 23, 2002, entitled "SYSTEMS AND METHODS FOR CORRECTING GAIN ERROR DUE TO TRANSITION DENSITY VARIATION IN CLOCK RECOVERY SYSTEMS"; U.S. patent application Ser. No. 10/328,363, filed Dec. 23, 2002, entitled "PHASE LOCKED LOOP DEMODULATOR AND DEMODULATION METHOD USING FEED-FORWARD TRACKING ERROR COMPENSATION"; and U.S. patent application Ser. No. 10/328,358, filed Dec. 23, 2003, entitled "SYSTEMS AND METHODS FOR CORRECTING PHASE LOCKED LOOP TRACKING ERROR USING FEED-FORWARD PHASE MODULATION", the disclosures of which are hereby incorporated herein by reference.

TECHNICAL FIELD

This invention relates to analog computation circuits and more particularly to circuits and methods for designing and using analog circuits operating in the modulation domain.

BACKGROUND

Instrumentation systems sometimes require the generation of a time-varying signal that is the ratio of two other signals. This may be accomplished either with an analog divider computation circuit or it may be done by digitizing the two input signals and using numerical computation, commonly known as Digital Signal Processing (DSP). Digital techniques are limited to relatively low frequencies because of the intense computation load placed on the processor. Analog division can potentially have greater bandwidth, but is difficult to implement using conventional techniques.

A commonly used circuit and method to perform the division using logarithms is shown in FIG. 5. This circuit is based on the mathematical property that the logarithm of a quotient is equal to the difference of the logarithms of the dividend and divisor.

As shown in FIG. 5, input signals n(t) and d(t) to circuit 50 are conditioned by passing each of them through logarithm function blocks 501 and 502 respectively. The logarithms of the input signals are subtracted by block 503 and the result is sent to anti-logarithm (exponentiation) block 504. The accuracy of nonlinear circuit 50 depends upon how accurately the logarithmic (501, 502) and antilogarithmic (504) functions are realized. If the signals involved have wide dynamic range, then the transistors within the calculation blocks must operate over a wide range of currents. This increases the difficulty of achieving accurate nonlinear functions. Also, when the current is small, bandwidth tends to suffer. The design equations for this type of circuit are all highly temperature dependent, making drift a problem. It is also difficult to obtain a low noise floor using analog circuits as described.

Another commonly used circuit and method is to use a multiplier, such as multiplier 602, in a feedback path of a servo loop, as shown in FIG. 6 circuit 60. This has the effect of using a multiplier to obtain division when its output is fed into subtractor 601. Such a circuit is an inverse multiplier analog divider. Multiplier 602 is commonly constructed as a Gilbert multiplier. There are two main practical difficulties with this circuit. First the divider accuracy can be no better than the accuracy of the multiplier. Although a Gilbert multiplier is somewhat easier to build than the logarithmic circuits of FIG. 5, it still has problems with linearity, dynamic range, and noise. Second, the accuracy of the circuit is also affected by errors in the servo loop. Impairments in servo amplifier 603 can cause loop tracking errors, denoted $\epsilon$ in FIG. 6. Also, the loop gain varies depending on the characteristics of the signals being divided. This makes loop design difficult and loop dynamics unpredictable.

FIG. 7 shows Armstrong phase modulator 70 where sine wave carrier generator 701 drives multiplier 703 via amplifier 705 (gain −1) which is being used as a double side band suppressed carrier (DSB-SC) (balanced) modulator. A DSB-SC signal is the same as a conventional amplitude modulation signal, except that the carrier is suppressed. Modulation input port 710 drives the other input of multiplier 703. The output of multiplier 703 is a DSB-SC signal. The DSB-SC signal drives one input of adder 704. The other input to the adder is the carrier signal shifted 90° by shifter 702. Output 711 of adder 704 is a phase-modulated signal. The modulation index is proportional to the ratio of the amplitude of the DSB-SC signal to the injected carrier amplitude. Modulation index is defined as the peak phase deviation in radians.

For proper operation, the maximum modulation index must be within the "small angle approximation" regime, where phase modulation can be considered a linear process. This is also known as narrow band phase modulation (NBPM). In general, phase modulation (a member of the angle modulation family) is a non-linear process. The modulation index limit for NBPM is approximately 0.5, depending on the amount of modulation error that can be tolerated. For example, if the modulation index is limited to 0.45, then the harmonic distortion for tone modulation is less than 5%.

BRIEF SUMMARY

The present invention is directed to a system and method for performing analog division in the modulation domain. In one embodiment of the invention, a sine wave carrier is modulated by one of the input signals and a cosine wave carrier is modulated by the other of the input signals. These modulated signals are added together with the result being a modulated signal having a phase modulation index proportional to the ratio of the amplitudes of the first and the second input signals. This signal is then phase demodulated. The resulting baseband signal is proportional to the ratio of said first to said second signals.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
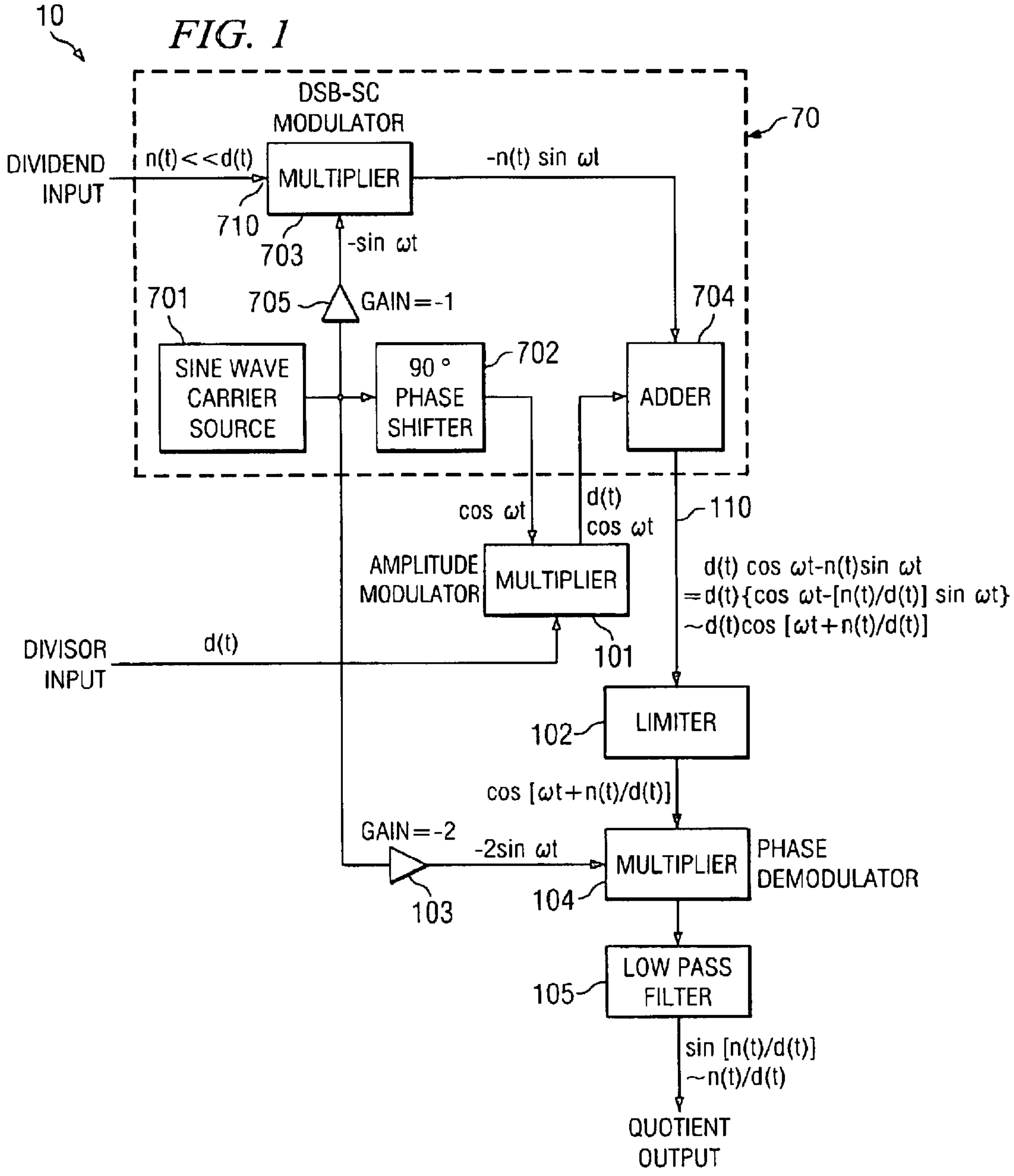
FIG. 1 shows one embodiment of a modulation domain analog divider.
Figure 7:
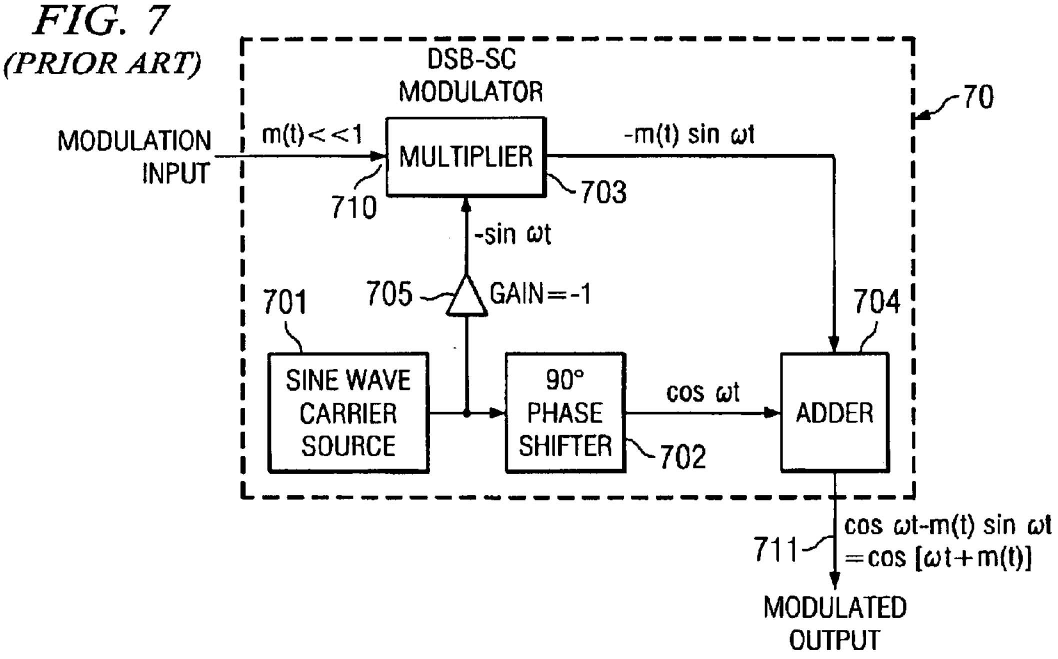
FIG. 7 (PRIOR ART)
FIG. 7 shows a prior art Armstrong phase modulator.

Circuit 10, shown in FIG. 1, shows one embodiment in which an Armstrong phase modulator, such as Armstrong phase modulator 70 (shown in FIG. 7 and discussed above), is modified so as to break out the carrier injection path between 90° phase shifter 702 and adder 704. An amplitude modulator, for example, multiplier 101, is inserted in this path. Divisor signal d(t) drives the modulation port of amplitude modulator 101. Amplitude modulator 101 controls the amount of carrier signal injected into adder 704. Meanwhile, dividend input signal n(t) drives modulation port 710 of the DSB-SC modulator. The DSB-SC carrier signal out of the DSB-SC modulator (as discussed above) is combined in adder 704 with the injected amplitude modulated carrier signal from circuit 101, to produce a phase-modulated signal at output 110 of the modified Armstrong phase modulator. The phase modulation index of this signal is proportional to the ratio of the dividend signal to the divisor signal. Thus, a division of the dividend signal by the divisor signal has taken place in the modulation domain.

The signal at the output of the modified Armstrong phase modulator is also amplitude modulated by the divisor signal. This is unlike a normally operating conventional Armstrong phase modulator, which has no amplitude modulation of the output. Limiter 102 strips off this incidental amplitude modulation without affecting the phase modulation. The output of limiter 102 drives a phase demodulator consisting of multiplier 104 followed by low pass filter 105. The other port of multiplier 104 is driven (via amplifier 103 having a gain of −2) from carrier source 701. Low pass filter 105 rejects spurious signals near the second harmonic of the carrier. Output 111 of low pass filter 105 consists of the recovered modulation; in other words, the desired quotient as a baseband signal.

The equivalent constraint to the modulation index of less than ½ in the conventional Armstrong modulator in this case is that the quotient be less than ½. It is to be understood that in cases where a quotient larger than ½ would result from a given set of input signals, the dividend signal can be attenuated (or the divisor increased) by an appropriate factor before being processed and amplified (attenuated) by the same factor after processing. These adjustments could be made within circuit 703 (and/or circuit 101) or could be external thereto.

It should be understood that multipliers 703, 101, and 104 are shown for illustrative purposes only and that the DSB-SC modulator, amplitude modulator, and phase demodulator can each be implemented in many ways other than as a multiplier. In the preferred embodiment, this function would be implemented by frequency mixers, using switches and passive components. Further, it should be understood that there may be many implementations of the Armstrong modulator known to those skilled in the art, any of which can be used, assuming that they are amenable to the concepts discussed above. Also, amplitude modulation can be accomplished by voltage controlled attenuation or amplification, if desired. It should be understood that limiter 102 may not be necessary if the phase detector is either inherently insensitive to amplitude modulation or performs a limiting function in conjunction with demodulation. For example, if multiplier 104 were actually inherently insensitive to amplitude modulation, the circuit would not require limiter 102.

In circuit 10 the combination of the two multipliers (703, 101) adder 704, and 90° phase shifter 702 constitute what is commonly referred to as an "I/Q modulator," which is a vector modulator with inputs in cartesian format. The axes are labeled "I" and "Q" meaning in-phase and quadrature.

Figure 2:
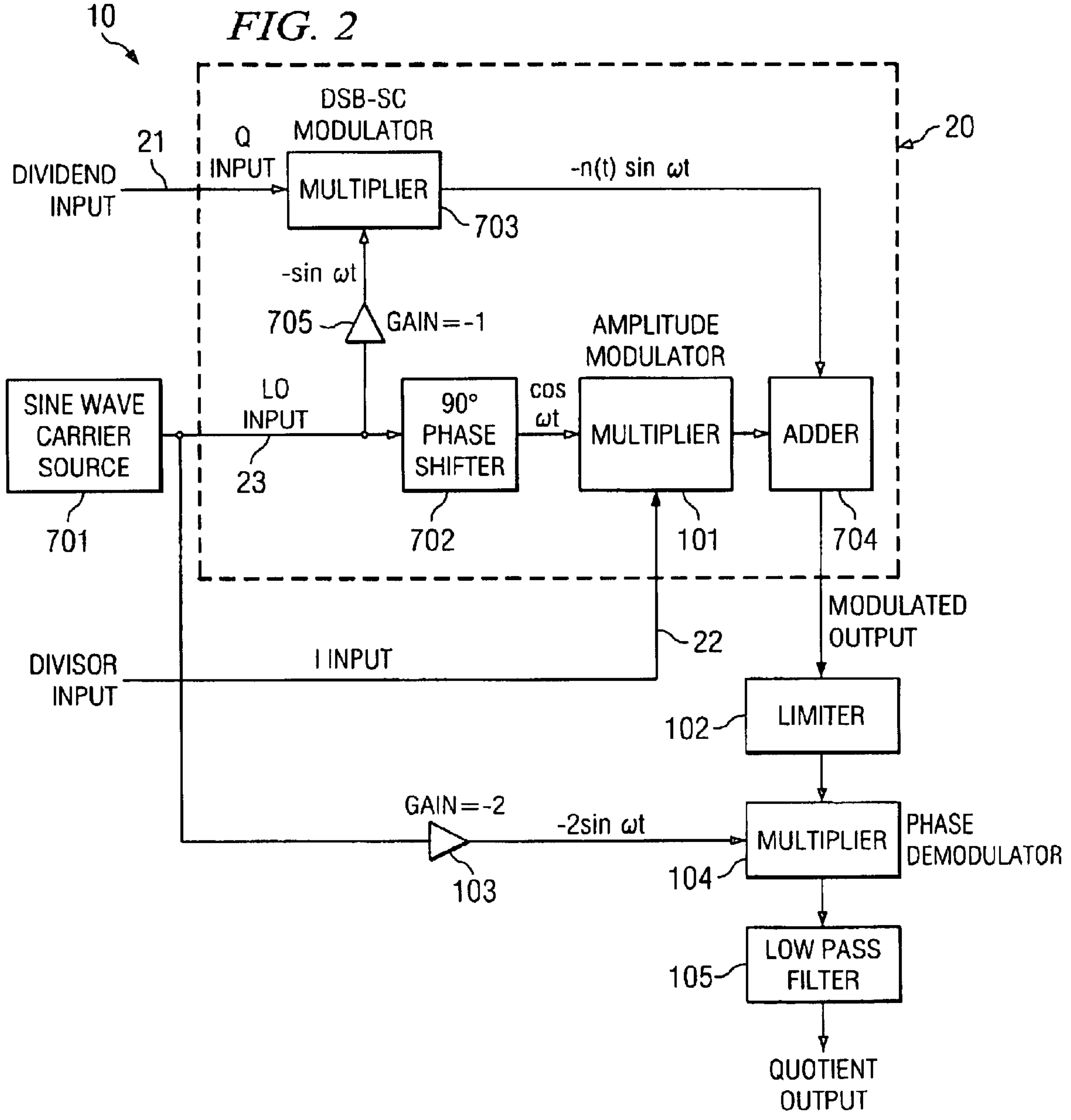
FIG. 2 shows one alternative embodiment using I/Q modulation.

FIG. 2 shows an alternate description of FIG. 1 showing I/Q modulator 20, where the dividend input is sent to Q input 21 and the divisor input is sent to I input 22. The carrier source input goes LO to, input 23. This circuit functions as discussed with respect to FIG. 1. Note that while not shown, the phase shifted signal could also be externally applied.

Figure 3:
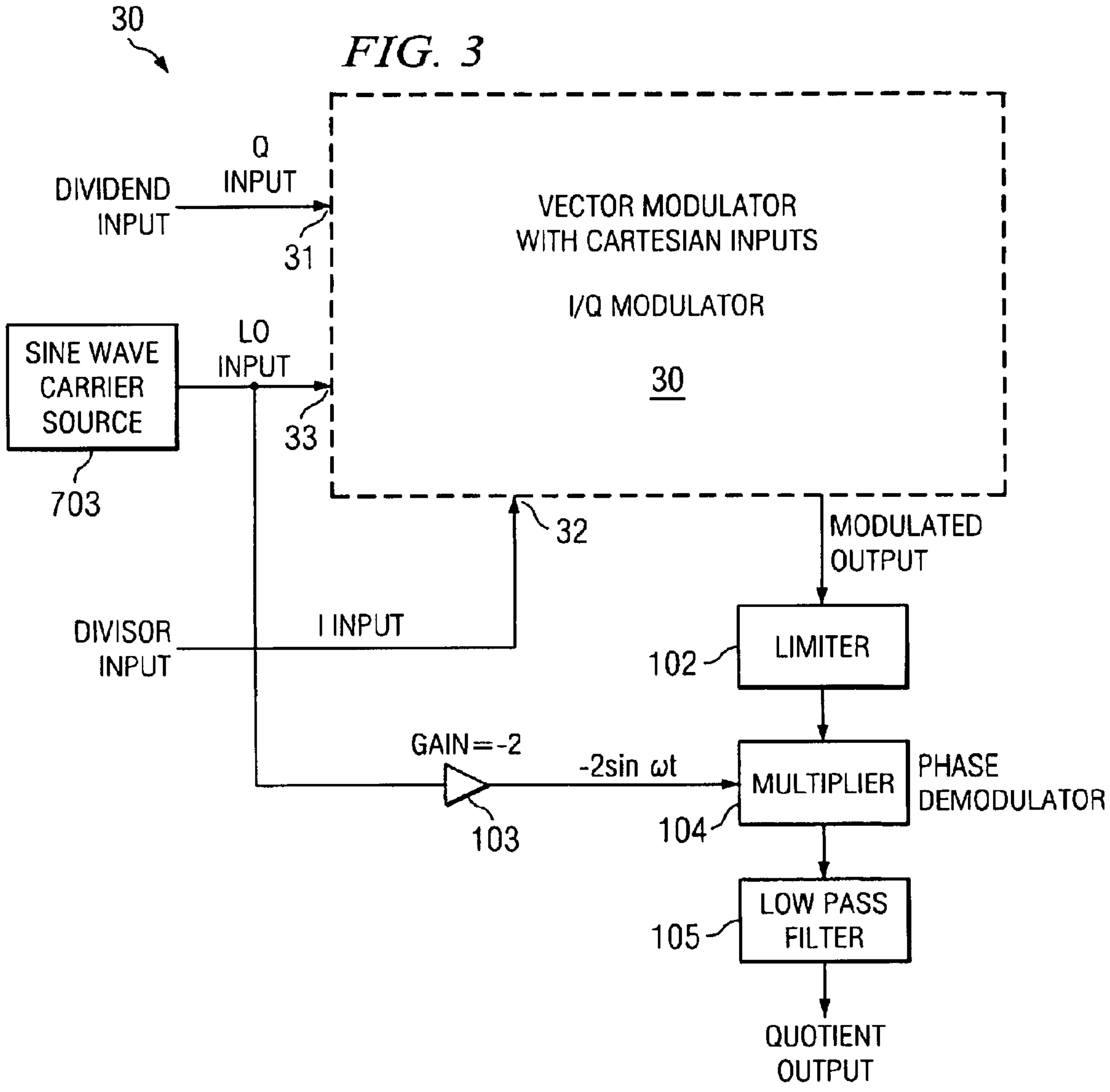
FIG. 3 shows one alternative embodiment using a generic vector modulator with cartesian inputs.

FIG. 3 shows generic I/Q modulator 30 and the concepts discussed herein can be employed using implementations of any form of cartesian vector modulation, regardless of how they are internally constructed. The dividend input is the Q input and goes to terminal 31 while the divisor input is the I input and goes to terminal 32. The carrier source input goes to LO terminal 33. Again, this circuit functions as discussed above with respect to FIG. 1. Furthermore, the limiter/phase demodulator could have any implementation, not confined to the multiplier configuration shown. For example, a frequency discriminator followed by an integrator would work.

Also, the I and Q inputs to the vector modulator can be interchanged, although this may require inserting a 90° phase shift into the LO connection to the demodulator.

Figure 4A:
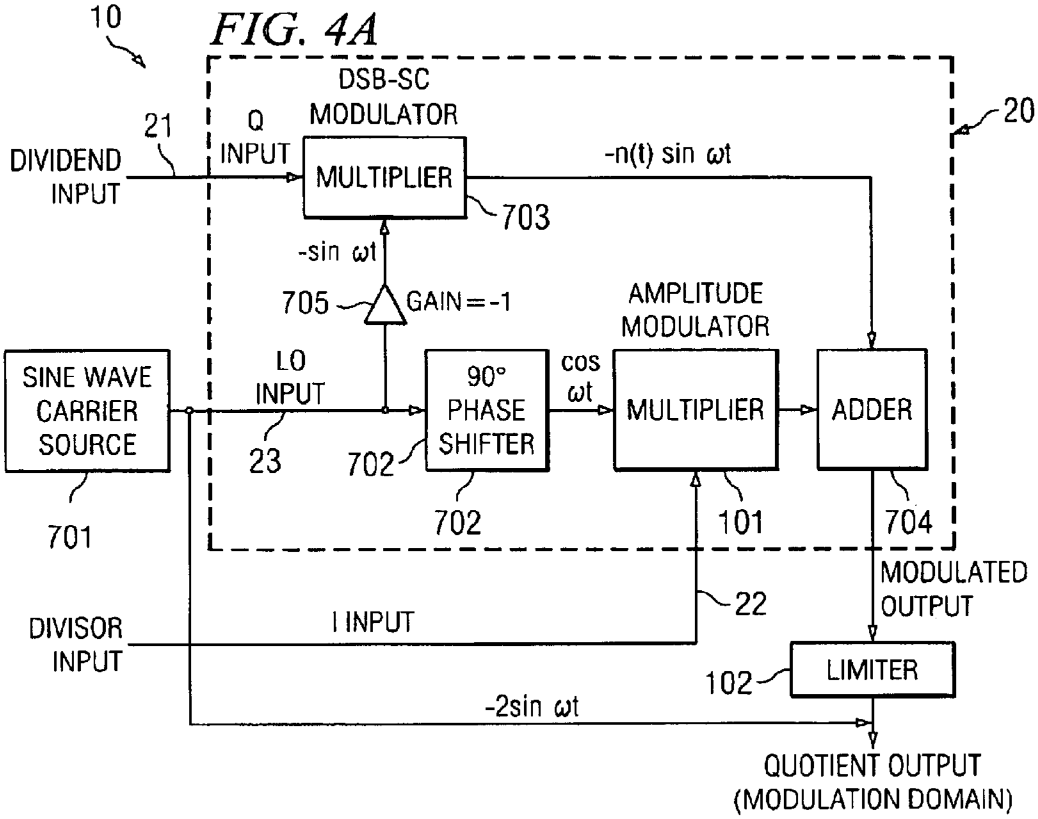
FIGS. 4A, 4B and 4C show alternative circuit arrangements where the output or an input operates in the modulation domain.
Figure 4B:
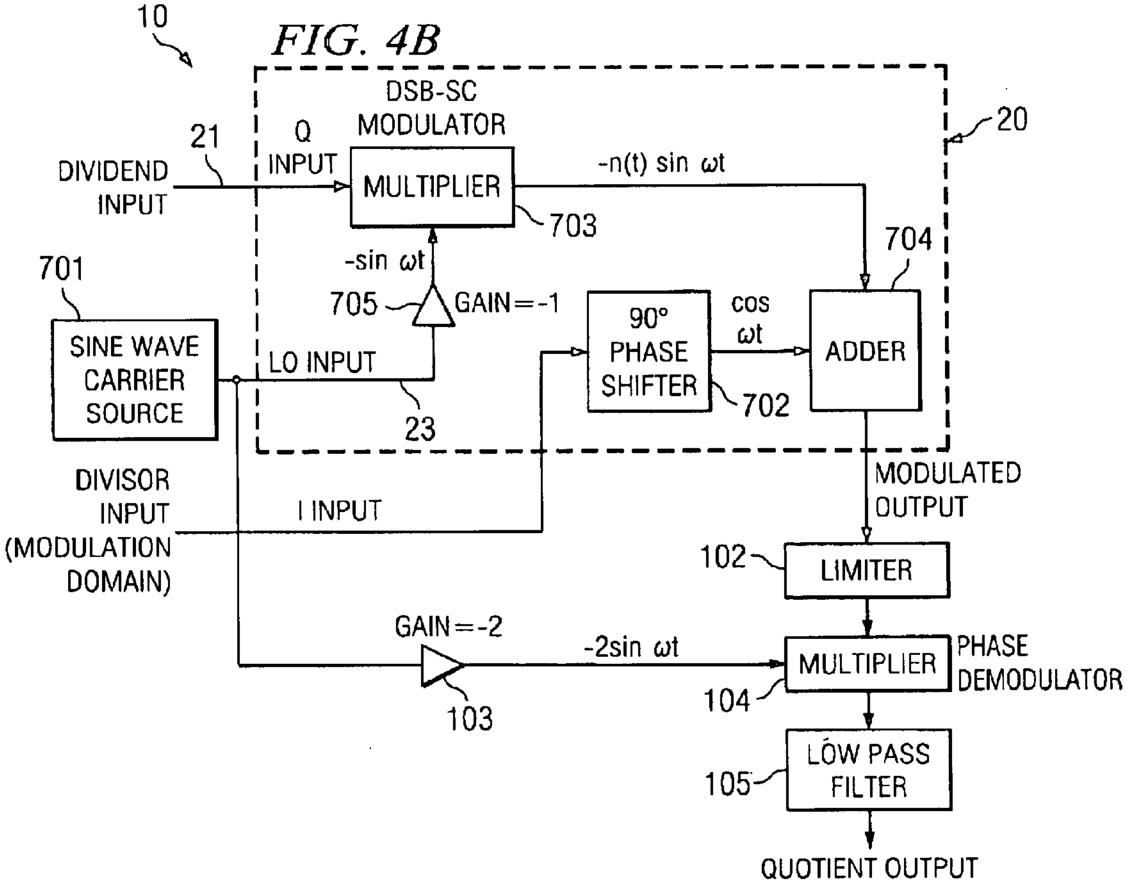
Figure 4C:
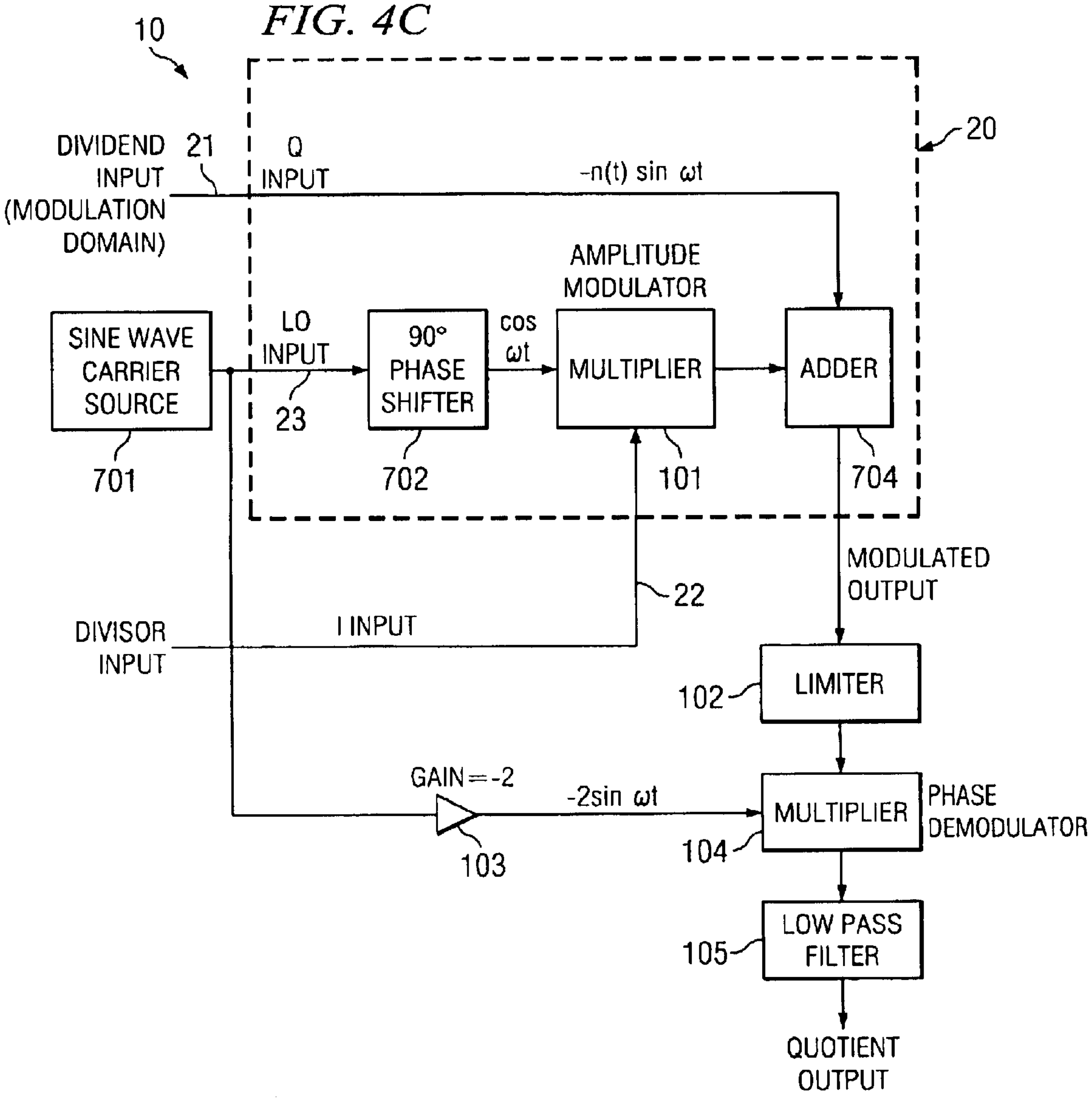
Figure 5:
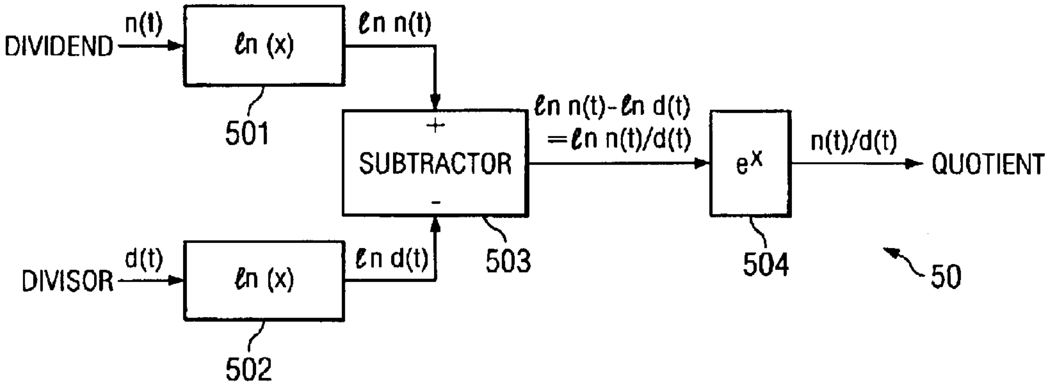
FIG. 5 (PRIOR ART)
FIG. 5 shows a prior art logarithmic analog divider.
Figure 6:
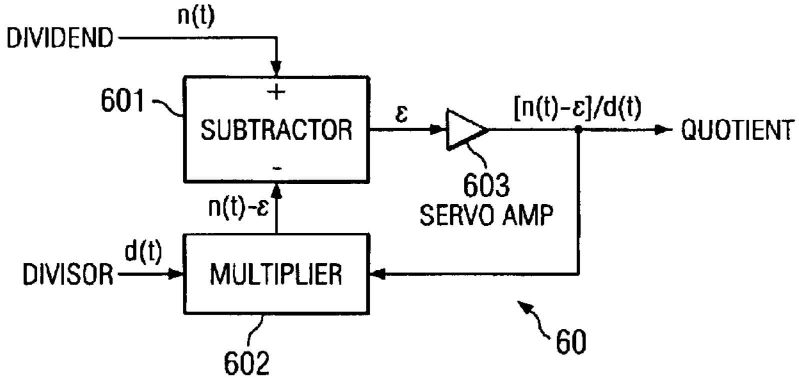
FIG. 6 (PRIOR ART)
FIG. 6 shows a prior art inverse multiplier analog divider.

Although the discussion has focused on baseband input and output signals being processed in the modulation domain, it is to be understood that it is also possible to convert any or all ports to modulation domain ports as shown in FIG. 4A, where the quotient output is taken out in the phase modulation domain by by-passing the phase demodulator, e.g., multiplier 104 of FIG. 2. In FIG. 4B, the divisor input is taken in from the amplitude modulation domain by by-passing the amplitude modulator, e.g., multiplier 101 of FIG. 2, and inputting the devisor input (in the modulation domain) into a phase shifter, e.g., phase shifter 702. In FIG. 4C, the dividend input is taken in from the phase modulation domain, by-passing the multiplier, e.g., multiplier 703 of FIG. 2, and using, for the carrier input to the adder, e.g. adder 704, a sine wave that is phase modulated by the dividend signal.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit for providing an output signal that is the ratio of two input signals, said circuit comprising:

means for receiving a divisor input signal and a dividend input signal; and means for providing a quotient signal having a phase modulation index proportional to the ratio of said dividend input signal to said divisor input signal.

2. The circuit of claim 1 further comprising:

means for phase demodulating said quotient signal to provide an output signal as a baseband signal.

3. The circuit of claim 2 wherein said providing means is an Armstrong phase modulator modified to have its modulation sensitivity controllable.

4. The circuit of claim 2 wherein said quotient signal may include amplitude modulation and wherein said circuit further includes:

means for removing any said amplitude modulation from said quotient signal.

5. The circuit of claim 4 wherein said removing means is a limiter inserted ahead of said phase demodulating means.

6. The circuit of claim 1 wherein said providing means includes a vector modulator having cartesian inputs.

7. The circuit of claim 1 wherein said providing means includes an I/Q modulator where the Q input receives the dividend input signal and wherein the I input receives the divisor input and the LO input receives a carrier source input.

8. The circuit of claim 1 wherein said providing means includes an I/Q modulator where the I input receives the dividend input signal and wherein the Q input receives the divisor input and the LO input receives a carrier source input.

9. The circuit of claim 2 wherein said phase demodulating means receives as one input said quotient signal and receives as a second input a non-phase shifted amplified carrier signal.

10. The circuit of claim 9 wherein said phase demodulator means is a multiplier.

11. The circuit of claim 10 wherein an output signal of said multiplier is low pass filtered.

12. A circuit for dividing a first analog signal by a second analog signal, said circuit comprising:

a double side band suppressed carrier modulator for accepting said first analog signal and for accepting a sine wave carrier signal;

an amplitude modulator for accepting said second analog signal and for accepting a phase shifted carrier signal;

an adder for combining the outputs of said double side band suppressed carrier modulator and said amplitude modulator; and a phase demodulator for accepting said carrier signal and for accepting the output of said adder, said phase demodulator providing, as an output, a signal which is said first signal divided by said second signal.

13. The circuit of claim 12 wherein at least one of said double side band suppressed carrier modulator, said amplitude modulator and said phase modulator is a multiplier circuit.

14. The circuit of claim 12 further including:

a limiter for accepting the output from said adder prior to said output being supplied to said phase modulator.

15. A circuit for processing input signals, said circuit comprising:

a first multiplier having one input for accepting one of said input signals and a second input for accepting a sine wave carrier signal;

a second multiplier having one input for accepting a second one of said input signals and a second input for accepting a signal which has been phase shifted from said sine wave carrier;

an adder for adding the outputs of said multipliers to provide an added output signal; and a third multiplier having one input for accepting said added output signal, a second input for accepting said sine wave carrier signal so as to provide an output signal which is the quotient of said first signal divided by said second signal.

16. The circuit of claim 15 further comprising:

a limiter for stripping off at least a portion of the amplitude modulation of said added output signal.

17. An analog divider circuit, comprising:

a first input line for receiving a first analog signal;

a second input line for receiving a second analog signal;

a first amplitude modulator for amplitude modulating a first carrier signal by said first analog signal;

a second amplitude modulator for amplitude modulating a second carrier signal by said second analog signal, wherein said second carrier signal is out-of-phase relative to said first carrier signal by ninety degrees;

an adder for adding output signals from said first amplitude modulator and said second amplitude modulator; and a phase demodulator for demodulating an output signal from said adder to generate an analog quotient signal with an amplitude that is a ratio of amplitudes of said first analog signal and said second analog signal.

18. The analog divider of claim 17 further comprising:

a limiter disposed between said adder and said phase demodulator.

19. The analog divider of claim 17 further comprising:

a low pass filter for filtering said analog quotient signal.

20. A method of operating a divider circuit, comprising:

receiving first and second analog signals;

amplitude modulating first and second carrier signals, that are ninety degrees out-of-phase, respectively by said first and second analog signals;

combining said first and second amplitude modulated carrier signals to generate a phase modulated combined signal; and phase demodulating said phase modulated combined signal to generate a quotient signal with an amplitude that is a ratio of amplitudes of said first and second analog signals.

21. The method of claim 20 further comprising:

filtering said quotient signal.

22. The method of claim 20 further comprising:

limiting said phase modulated first carrier signal after performing said combining.

23. An analog divider circuit, comprising:

a vector modulator receiving first and second input signals, wherein said vector modulator is operable to perform phase modulation using said first and second input signals to generate a modulation domain signal with a modulation index that is proportional to a ratio of said first and second input signals; and a phase demodulator coupled to said vector modulator to receive said modulation domain signal, wherein said phase demodulator generates a quotient signal with an amplitude that is a ratio of amplitudes of said first and second analog signals.

24. The analog divider circuit of claim 23, wherein said vector modulator amplitude modulates a carrier signal by said first signal to generate a third signal, amplitude modulates said carrier signal by said second signal to generate a fourth signal, phase-shifts said fourth signal, and adds said third signal to said phase-shifted fourth signal.

25. The analog divider circuit of claim 23 further comprising:

a low pass filter for rejecting spurious signals near a second harmonic of said carrier.

* * * * *